United States Patent [19]
Yamagiwa et al.

[11] Patent Number: 4,829,256
[45] Date of Patent: May 9, 1989

[54] INSULATION TESTING DEVICE FOR GAS INSULATED APPARATUS

[75] Inventors: Tokio Yamagiwa; Toshio Ishikawa, both of Hitachi, Japan

[73] Assignee: Hitachi, Ltd., Tokyo, Japan

[21] Appl. No.: 71,358

[22] Filed: Jul. 9, 1987

[30] Foreign Application Priority Data

Jul. 11, 1986 [JP] Japan ................ 61-163272

[51] Int. Cl.[4] ............................. G01R 31/12
[52] U.S. Cl. ........................ 324/557; 324/527; 324/536
[58] Field of Search ............ 324/557, 551, 552, 522, 324/523, 520, 536, 514, 547, 548, 549, 55, 415, 418, 424

[56] References Cited
U.S. PATENT DOCUMENTS

| | | | |
|---|---|---|---|
| 2,324,835 | 7/1943 | Hagenguth | 324/552 X |
| 4,338,561 | 7/1982 | Zaengle et al. | 324/551 X |
| 4,549,132 | 10/1985 | Yamagiwa et al. | 324/536 X |

*Primary Examiner*—Reinhard J. Eisenzopf
*Assistant Examiner*—Robert W. Mueller
*Attorney, Agent, or Firm*—Antonelli, Terry & Wands

[57] ABSTRACT

In an insulation testing device for testing insulation characteristics of a gas insulated apparatus, at least one pair of positive and negative polarity impulse voltages each having a duration shorter than a half period of a commercial frequency voltage are applied to the gas insulated apparatus by a test voltage generator.

5 Claims, 4 Drawing Sheets

FIG. IA
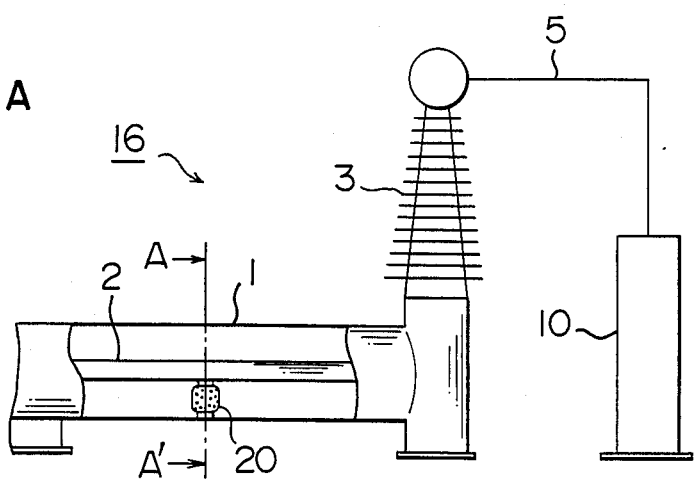
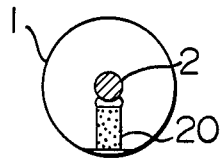
FIG. IB
FIG. 2
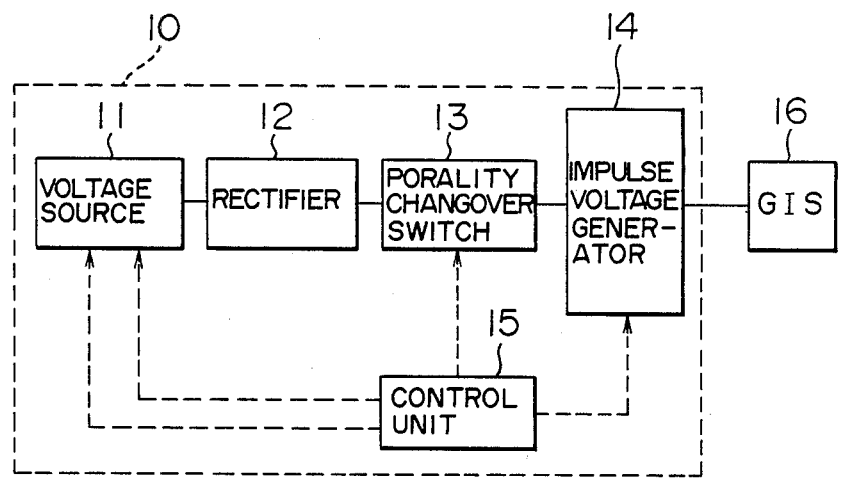

INSULATION TESTING DEVICE FOR GAS INSULATED APPARATUS

BACKGROUND OF THE INVENTION

1. Field of the Invention

The present invention relates to an insulation testing device for a gas insulated apparatus, and particularly relates to an insulation testing device for testing an initial state of defective insulation by effectively detecting electrically-conductive (hereinafter simply referred to as "conductive") foreign particles attached to the surfaces of insulators of a gas insulated apparatus, which become harmful in the operating condition.

2. Description of the Prior Art

Heretofore, in general, an AC voltage of a commercial frequency has been used as a test voltage when an insulation test of a gas insulated apparatus is carried out at a place where the gas insulated apparatus is installed, as described in "Electrical Cooperative Research", Vol. 39, No. 6, February in 1984, page 133, issued by The Society of Electrical Cooperative Research. According to a practice in Japan, a relatively low voltage equivalent to 110% of an operating voltage of a gas insulated apparatus has been employed as a test voltage used in the test of the apparatus in the location where the apparatus is installed, because it has been supposed that the final test at the factory has been sufficiently carried out for the gas insulated apparatus.

On the other hand, the insulation property of a gas insulated apparatus is often remarkably lowered unlike that of an conventional air insulated apparatus when contaminated with fine conductive foreign particles. particularly under the condition that an AC voltage of a commercial frequency is applied, conductive foreign particles in an applied electric field are cause to float by electrostatic force so as to stray within the gas insulated apparatus, because the duration of voltage application is too long. The conductive foreign particles which are present in a relatively low intensity electric field in the initial state of an insulation test, may be moved and attached to a part of the insulated apparatus so as to be harmful to the insulation. Generally, lowering of insulation little occurs when the conductive foreign particles stray in a gas space, but great lowering of insulation occurs when the foreign particles are attached to the insulator surface. Accordingly, to maintain the insulation reliability of the gas insulated apparatus for a long time, the insulation test voltage at the location of installation of the gas insulated apparatus must be made as high as possible. From this point of view, outside Japan, an AC voltage of a commercial frequency equivalent to 75 to 80% of an insulation test voltage at the factory has been employed as the test voltage as described in the aforementioned paper. The voltage shows a value 1.7 times to 2 times as much as a normal operating voltage.

Recently, a tendency to use a switching impulse voltage for the on-site insulation test is seen, as discussed in the paper "High Voltage Testing of Metal-enclosed, Gas-insulated Substations On-site With Oscillating Switching Impulse Voltage", by K. Feser, HAEFELY El-44, 1979/7.155

However, the aforementioned technique has two problems as follows.

One of the problems relates to the value of the on-site test voltage. Application of a voltage higher than an AC voltage of a commercial frequency is most effective in view of reliability, but the maximum value of an AC voltage of a commercial frequency in the operating state is not larger than about 130% of the rated operation voltage of the apparatus. Application of a voltage higher than 130% of the rated operation voltage induces a possibility that conductive foreign particles harmless in general may be moved to a part of the insulated apparatus so as to become harmful to the insulation.

The other problem relates to the applied voltage waveform in the actual operating state.

It is supposed that the excessive voltage over 130% of the rated operation voltage is different in waveform from a commercial frequency voltage but has a waveform of a short-duration switching impulsive voltage. Further, it is necessary to determine the maximum value of the applied voltage taking even a limit voltage of a lightning arrester or the like into consideration.

SUMMARY OF THE INVENTION

It is therefore an object of the present invention to solve the aforementioned problems in the prior art.

It is another object of the present invention to provide an on-site insulation testing device which is effective in practical use and which is highly reliable.

To attain the aforementioned objects, the insulation testing device of the invention is arranged so that an insulation test voltage in which a voltage of a positive polarity and a voltage of a negative polarity each having a duration shorter than a half period of a commercial frequency voltage appears alternately, is applied to a high voltage part of a gas insulated apparatus.

When conductive foreign particles are attached to a surface of an insulator, the insulation property widely varies depending on the waveforms of the applied voltage. Of the waveforms used for an insulation test, the waveform of a commercial frequency voltage is most severe for the insulation property. However, it is confirmed experimentally that the insulation characteristics obtained upon application of a switching impulse voltage waveform in which a positive polarity and a negative polarity appear alternately onto a gas insulated apparatus is substantially the same as those obtained upon application of a commercial frequency voltage waveform onto the same apparatus. Therefore, the aforementioned problems are solved by use of a high voltage generator capable of generating such a switching impulse voltage waveform.

In short, even if a switching impulse voltage having a duration shorter than a half cycle of a commercial frequency voltage is applied to an insulated apparatus, and electrostatic force exerted on to conductive foreign particles is sufficiently low compared to that in the case of application of a commercial frequency voltage. Accordingly, a highly reliable insulation test can be carried out under the condition that the applied voltage is not so widely different from the actual operation voltage.

According to the present invention, an insulating part of a gas insulated apparatus can be tested under the actual operating conditions. Accordingly, when conductive foreign particles are attached to an insulating part of a gas insulated apparatus, the insulation characteristics at the insulating part can be maintained substantially equally to those in the case of application of a commercial frequency voltage, and it is possible to avoid application of a commercial frequency voltage which is impossible to be generated in an actual case.

Accordingly, the dielectric strength of an insulated apparatus can be prevented from being designed excessively, resulting in reduction in manufacturing cost of the insulated apparatus.

BRIEF DESCRIPTION OF THE DRAWINGS

Other objects, features and advantages of the present invention will be apparent more fully from the following description taking in conjunction with the accompanying drawings, wherein:

FIG. 1A is a schematic view showing the high voltage part of a gas insulated apparatus to which a test voltage is applied by an insulation testing device according to the present invention;

FIG. 1B is a cross section of the high voltage part taken along the line A-A' of FIG. 1A;

FIG. 2 is a block diagram showing the insulation testing device of FIG. 1A;

DESCRIPTION OF THE PREFERRED EMBODIMENT

Figure 3:
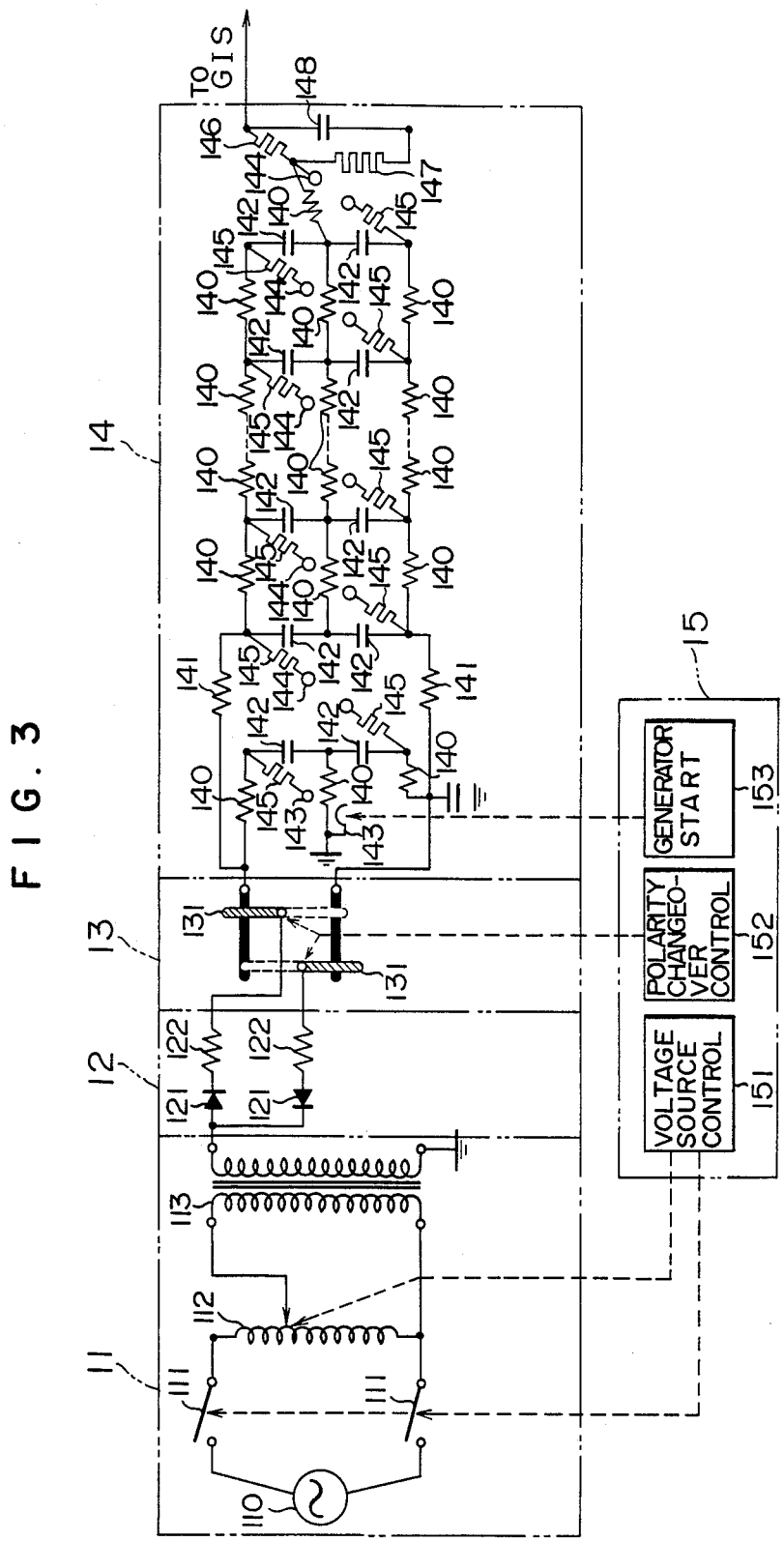
FIG. 3 is an electric circuit diagram of the insulation testing device of FIG. 2.

An embodiment of the present invention is described hereunder with reference to the drawings.

FIG. 1A shows an arrangement of the high voltage part of a gas insulated apparatus to be tested in the present invention, and FIG. 1B shows a cross section of the high voltage part. A high voltage conductor 2 acting as a bus bar is disposed within a grounded tank 1 of the gas insulated apparatus and fixedly supported by an insulating spacer 20 so as to be insulated from other parts. A bushing 3 is provided at the part where the high voltage conductor 2 acting as a bus bar is led out in the air. According to the present invention, to the thus arranged gas insulated apparatus, a high test voltage is applied through the bushing 3 by a test voltage generator 10 at a final test when the assembling of the aforementioned gas insulated apparatus is finished.

FIG. 2 is a block diagram showing the test voltage generator 10 according to the present invention. In FIG. 2, an AC voltage supplied from an AC voltage source 11 is converted into a DC voltage by a rectifier 12. The DC voltage is switched over by a polarity changeover switch 13 so as to produce an output in which a positive voltage and a negative voltage appear alternately. The output voltage of the polarity changeover switch 13 is applied to an impulse voltage generator 14.

The impulse voltage generator 14 may be a known one used generally. That is, in the impulse voltage generator 14, electrical charges accumulated in a capacitor are discharged to a suitable wave-shaping circuit through a gap to thereby generate an impulse voltage of a desired waveform. Thus, a test voltage of the necessary waveform (that will be described in detail later) is applied to the gas insulated apparatus to be tested, through a voltage application line 5 from the impulse voltage generator 14.

FIG. 3 is an electric circuit diagram of the test voltage generator 10 of FIG. 2. In the voltage source 11, an AC voltage from an AC source 110 is applied to a voltage regulator 112 through a switch 111 having a pair of contacts for making and breaking the circuit. The AC voltage regulated by the voltage regulator 112 is applied to the primary winding of a main transformer 113, so that a boosted high voltage is generated from the secondary winding of the main transformer 113. The make- and-break operation of the switch 111 and the voltage regulation of the voltage regulator 112 are controlled by a voltage source control circuit 151 of a control unit 15. The rectifier 12 includes a pair of rectifier elements 121 and a pair of resistors 122 to carry out full-wave rectification of the high voltage supplied from the main transformer 113. The polarity changeover switch 13 includes a pair of contacts 131 to which the rectified voltages of a positive and a negative polarity are respectively applied from the rectifier 12. The changeover operation of the contacts 131 is controlled by a polarity switching control circuit 152 of the control unit 15. The impulse voltage generator 14 is illustrated as that of the voltage doubler serial charge type. Each of the voltages of the positive and negative polarities from the polarity changeover switch 13 charges main capacitors 142 respectively through charging resistors 140 and 141. When the charge voltage of the capacitors 142 reaches a value determined by the voltage source 11, a starting signal is generated from a generator starting circuit 153 of the control unit 15. The starting signal from the starting circuit 153 is applied between starting gap terminals 143 of the impulse voltage generator 14, so that discharge occurs between the starting gap terminals 143. Owing to the discharge between the starting gap terminals, electrical charges accumulated in the capacitors 142 are discharged through discharge gap terminals 144 and damping resistors 145. The value of the thus generated impulse voltage is determined by the values of resistors 146 and 147 and a capacitor 148.

Figure 4:
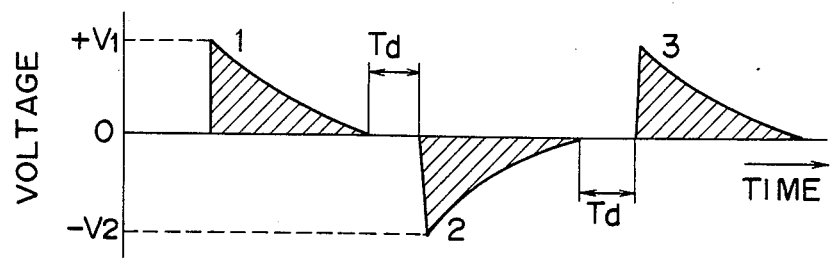
FIG. 4 is a diagram showing a waveform of a test voltage applied to the gas insulated apparatus by the insulation testing device according to the present invention.

The impulse voltage with alternations of a positive polarity ($+V_1$) and a negative polarity ($-V_2$) as shown in FIG. 4 is employed as a test voltage. It is effective that the time distance Td between a positive polarity voltage ($+V_1$) and a negative polarity voltage ($-V_2$) is made to be as short as possible. In practice, however, there is no problem in insulation characteristics when the time distance Td is selected to be of the order of several minutes. In regard to the procedure of impulse voltage application and the number of times of repetitions, it is necessary that an alternation of a positive polarity voltage and a negative polarity voltage is applied at least once. It is preferable that both polarity inversions, from positive to negative and from negative to positive, are carried out. Accordingly, it is desirable that the impulse voltage of the alternation of positive and negative polarities is applied three or more times.

By the application of the impulse voltage in such a manner as described above, an insulation test for detecting harmful conductive foreign particles attached to the insulating spacer 20 and other parts can be carried out with substantially the same detection sensitivity as in the case where a commercial frequency voltage is applied as a test voltage.

Figure 5:
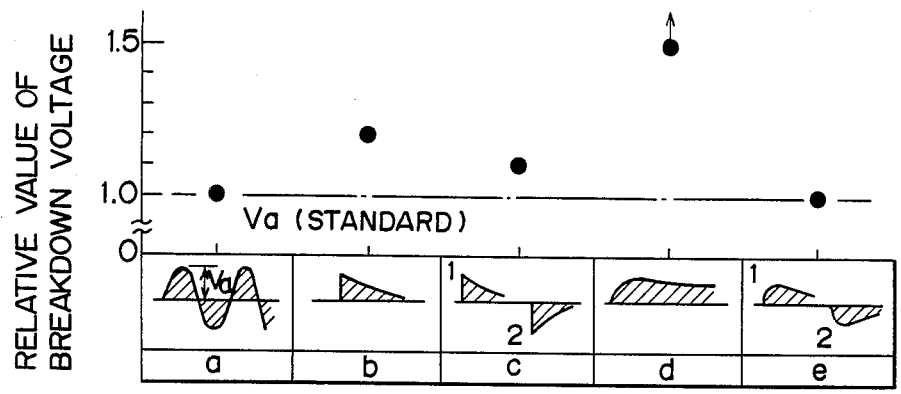
FIG. 5 is a diagram showing relative breakdown voltage values with respect to various test voltages applied to the gas insulated apparatus.

FIG. 5 shows relative breakdown voltage values to various test voltages applied to the gas insulated apparatus when conductive foreign particles are attached to an insulator surface of the gas insulated apparatus. The case a is obtained under application of a commercial frequency voltage. The breakdown voltage Va in this case is the lowest among various cases. The cases b to e are obtained under application of various impulse voltages. The values of breakdown voltage are shown relative to the value Va. In the case b, a single polarity lightning impulse voltage (having a wave head length of several μsec and a wave tail time of 10 μsec) is applied. In the case c, a lightning impulse voltage of a positive polarity and another lighting impulse voltage of a negative polarity are applied (the negative polarity voltage is applied after application of the positive polarity voltage). The breakdown voltages in the cases b and c are 10% to 20% higher than that in the case a. This shows that the cases b and c are inferior in detection sensitivity for conductive foreign particles. On the other hand, in the case d, a single polarity switching impulse voltage (having a wave front time of 10 to several 100 μsec and a wave tail time of 1000 μsec) is applied. In the case e, a switching impulse voltage of a positive polarity and another switching impulse voltage of a negative polarity are applied. The breakdown voltage in the case d is 50% or more higher than that in the case a, but the breakdown voltage in the case e is substantially equal to that in the case a. This phenomenon was confirmed experimentally.

In short, in the case where a switching impulse voltage of a positive polarity and a switching impulse voltage of a negative polarity are alternately applied to the gas insulated apparatus, the foreign particle detection sensitivity is substantially equalized to that in the case where a commercial frequency voltage is used.

On the other hand, a commercial frequency voltage has a great influence on the movements of conductive foreign particles because the duration of the applied voltage is too long. That is, if the applied voltage is so high as to be out of the bounds of possibility, harmless conductive foreign particles which will cause no problem in a normal condition with respect to insulation characteristics are inconveniently moved by the applied voltage. On the contrary, when the aforementioned switching impulse voltages are applied, the movements of such harmless conductive foreign particles which do not affect the insulation characteristics can be suppressed so that there is no bad influence on insulation characteristics.

Figure 6:
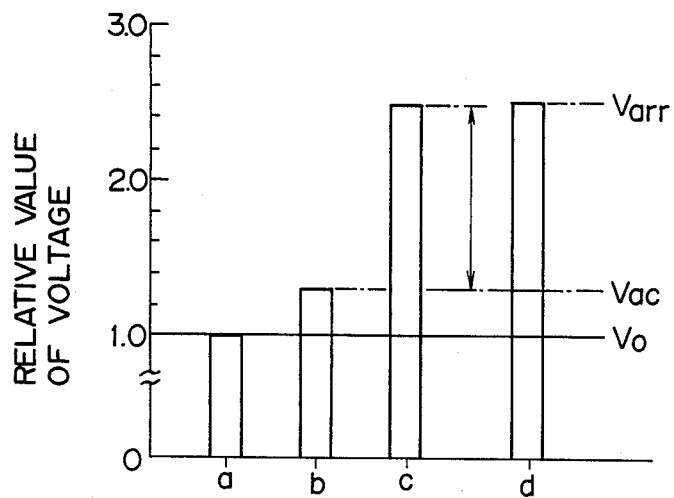
FIG. 6 is a diagram showing relative test voltage values applied to the gas insulated apparatus by the insulation testing device according to the present invention.

FIG. 6 shows applied voltage values. Symbol a shows the value of a commercial frequency operating voltage Vo. The symbol b shows the value of a commercial frequency overvoltage Vac which may occur in operation. The symbol c shows the value of a limit voltage Varr due to a lightning arrester or the like provided in the gas insulated apparatus. Generally, a commercial frequency voltage within the range of from Vo to Vac or an impulsive voltage within the range of from Vac to Varr can be applied to the gas insulated apparatus. Accordingly, any suitable voltage within the range of from Vac to Varr is recommended to be applied in the present invention.

In the case where a commercial frequency voltage higher than the overvoltage Vac is applied, the insulation test becomes so severe to the gas insulated apparatus that the test is disadvantageous in view of economy.

Figure 7A:
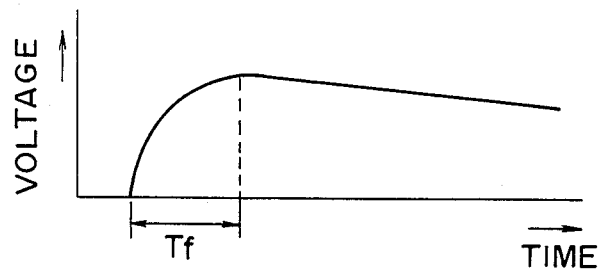
FIGS. 7A and 7B are graphs respectively showing a simple impulse voltage waveform and a damped oscillation impulse voltage waveform.
Figure 7B:
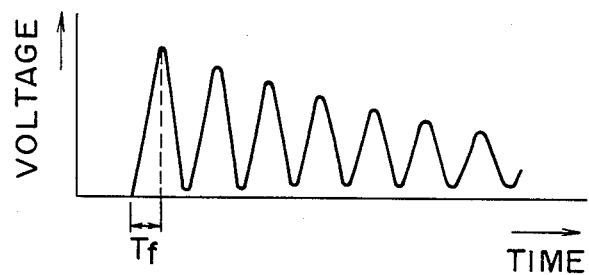

FIGS. 7A and 7B respectively show a simple impulse voltage waveform and a damped oscillation impulse voltage waveform. It is apparent from FIG. 5 that the wave front time Tf of the applied impulse voltage must not be short in order to attain insulation characteristics substantially equal to those in the case where a commercial frequency voltage is applied. According to the results of experiment, it is desirable that the wave front time Tf is several 10 μsec or more. If only the wave front time is several 10 μsec or more, the change of the waveform thereafter little affects the insulation characteristics. On the other hand, it is preferable that the wave tail time Tt is short. If the wave tail time is too long (several 1000 μsec or more), the applied voltage affects the movements of conductive foreign particles similarly to the case where a commercial frequency voltage is used.

Figure 8:
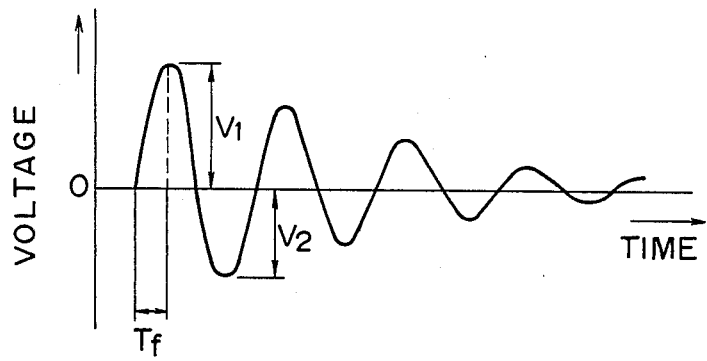
FIG. 8 is a diagram showing another waveform of a test voltage applied to the insulated apparatus.

FIG. 8 shows another waveform of a test voltage applied to the insulated apparatus. The different point from the voltage waveforms of FIGS. 7A and 7B is in that the voltage waveform of FIG. 8 oscillates between a positive polarity and a negative polarity. It is desirable that the wave front time Tf is several 10 μsec or more similarly to the case of FIG. 7. It is desirable that the first positive polarity shot $V_1$ and second negative polarity shot $V_2$ of the oscillation waveform satisfy the relation: $V_2/V_1 > 0.6$, because as shown by the cases d and e in FIG. 5, the breakdown voltage upon the application of a single polarity voltage and the breakdown voltage upon the application of a voltage having a polarity which is alternately reversed are lowered at the rate as described above. By use of a high voltage generator capable of generating the aforementioned voltage waveform, it is not necessary to carry out polarity inversion separately, resulting in simplification of the testing process.

We claim:

1. An insulation testing device for testing insulation characteristics of a gas insulated apparatus, comprising:
    test voltage generating means for applying an insulation test voltage to a high voltage part of the gas insulated apparatus;
    said test voltage generating means having means for alternately generating at least one pair of a voltage of a positive polarity and a voltag of a negative polarity each having a duration shorter than a half period of a commercial frequency voltage and each having a switching impulse waveform with a wave front time of at least 10 μsec.

2. An insulation testing device according to claim 1, in which each of the voltages generated by said test voltage generating means has an AC damped oscillation waveform.

3. An insulation testing device for testing insulation characteristics of a gas insulated apparatus by applying an insulation test signal to a high voltage part of the gas insulated apparatus, comprising:
    a voltage source for generating a variable AC voltage;
    a rectifier for rectifying a predetermined high voltage generated from said voltage source to provide a first high voltage of positive polarity and a second high voltage of negative polarity, respectively;
    polarity changeover switch means for switching over the output of said rectifier between the positive polarity high voltage and the negative polarity high voltage; and impulse voltage generator means for alternately generating at least one pair of predetermined positive polarity and negative polarity impulse voltages, each having a switching impulse waveform with a wave front time of at least 10 μsec and each having a duration shorter than a half period of a commercial frequency voltage, in response to the positive and negative polarity high voltage switched over by said polarity changeover switch means.

4. An insulation testing device according to claim 3, further comprising a control unit which includes:

voltage source control means for controlling an on-off switching operation and a voltage regulation of said voltage source;

polarity switching control means for controlling the polarity changeover of said polarity changeover switch; and generating starting means for applying a start signal to said impulse voltage generator means when a charged voltage on said impulse voltage generator means reaches a voltage value set by said voltage source.

5. An insulation testing device according to claim 3, wherein said impulse voltage generator means generates a first positive polarity impulse voltage of amplitude $V_1$ and a second negative polarity impulse voltage of amplitude $V_2$, and wherein $V_2/V_1$ is greater than 0.6.

* * * * *